(12) United States Patent
Saxler et al.

(10) Patent No.: US 7,405,430 B2
(45) Date of Patent: Jul. 29, 2008

(54) HIGHLY UNIFORM GROUP III NITRIDE EPITAXIAL LAYERS ON 100 MILLIMETER DIAMETER SILICON CARBIDE SUBSTRATES

(75) Inventors: Adam William Saxler, Durham, NC (US); Edward Lloyd Hutchins, Raleigh, NC (US)

(73) Assignee: Cree, Inc., Durham, NC (US)

(*) Notice: Subject to any disclaimer, the term of this patent is extended or adjusted under 35 U.S.C. 154(b) by 18 days.

(21) Appl. No.: 11/149,664

(22) Filed: Jun. 10, 2005

(65) Prior Publication Data

US 2006/0278891 A1    Dec. 14, 2006

(51) Int. Cl.
*H01L 29/15* (2006.01)
(52) U.S. Cl. .................. 257/77; 257/183; 257/190; 257/E29.081; 257/E29.104
(58) Field of Classification Search ............... 257/77, 257/183, 190, E29.081, 192, E29.104
See application file for complete search history.

(56) References Cited

U.S. PATENT DOCUMENTS

| | | | |
|---|---|---|---|
| 4,714,948 A | 12/1987 | Mimura et al. | |
| 5,196,358 A | 3/1993 | Boos | |
| 6,177,685 B1 | 1/2001 | Teraguchi et al. | |
| 6,316,793 B1 | 11/2001 | Sheppard et al. | |
| 6,548,333 B2 | 4/2003 | Smith | |
| 6,586,781 B2 | 7/2003 | Wu et al. | |
| 6,849,882 B2 | 2/2005 | Chavarkar et al. | |
| 2002/0066908 A1 | 6/2002 | Smith | |
| 2003/0020092 A1 | 1/2003 | Parikh et al. | |
| 2004/0061129 A1 | 4/2004 | Saxler et al. | |
| 2004/0137657 A1* | 7/2004 | Dmitriev et al. | 438/47 |
| 2006/0017064 A1* | 1/2006 | Saxler et al. | 257/194 |
| 2006/0121682 A1* | 6/2006 | Saxler | 438/312 |
| 2006/0225645 A1* | 10/2006 | Powell et al. | 117/105 |
| 2006/0226412 A1* | 10/2006 | Saxler et al. | 257/11 |
| 2007/0158785 A1* | 7/2007 | D'Evelyn et al. | 257/615 |

OTHER PUBLICATIONS

Keller, S., Effect of Growth Termination Conditions on the Performance of AlGaN/GaN High Electron Mobility Transistors; Applied Physics Letters, vol. 78, No. 20, May 14, 2001, pp. 3088-3090.
Carter, C H et al, "Large Diameter, Low Defect Silicon Carbide Boule Growth," Materials Science Forum, Aedermannsfdorf, CH, vol. 353-356, No. 3, (2002), pp. 3-6.
Muller S G et al, "Progress in the Industrial Production of SiC Substrates for Semiconductor Devices," Materials Science and Engineering B, Elsevier Sequoia, Lausanne, CH, vol. 80, No. 1-3 (Mar. 22, 2001), pp. 327-331.
Muller, S G et al, "The Status of SiC Bulk Growth from an Industrial Point of View," Journal of Crystal Growth, Elsevier, Amsterdam, NL, vol. 211, No. 1-4, (Apr. 2000), pp. 325-331.

* cited by examiner

*Primary Examiner*—Minh-Loan T Tran
(74) *Attorney, Agent, or Firm*—Summa, Allan & Addition, P.A.

(57) ABSTRACT

A semiconductor structure is disclosed that includes a silicon carbide wafer having a diameter of at least 100 mm with a Group III nitride heterostructure on the wafer that exhibits high uniformity in a number of characteristics. These include: a standard deviation in sheet resistivity across the wafer less than three percent; a standard deviation in electron mobility across the wafer of less than 1 percent; a standard deviation in carrier density across the wafer of no more than about 3.3 percent; and a standard deviation in conductivity across the wafer of about 2.5 percent.

77 Claims, 16 Drawing Sheets

HEMT on 4" SI SiC

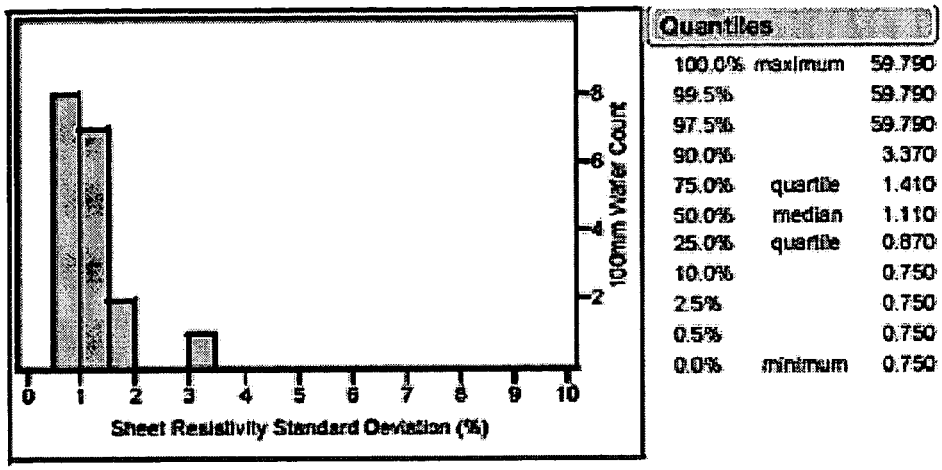

Sheet resistivity standard deviation for all HEMT epiwafers on 100 mm HPSI 4H-SiC substrates grown in Durham, NC on various programs.

Fig. 17

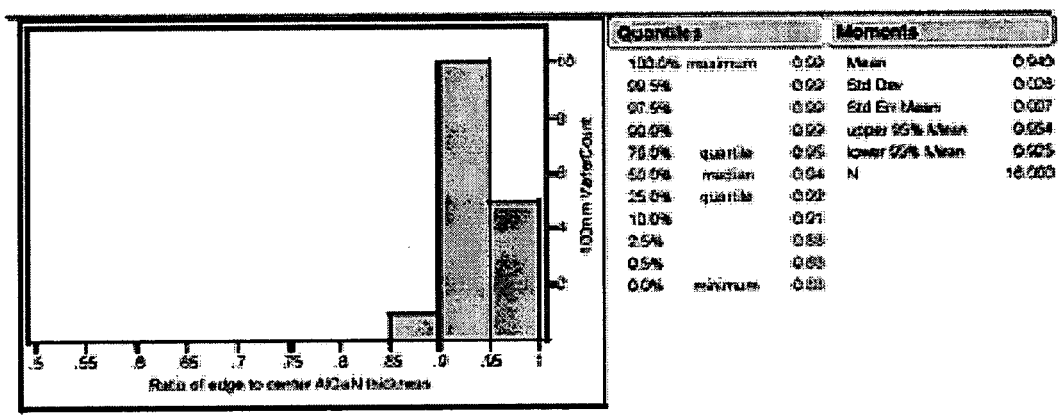

Ratio of AlGaN barrier thickness at edge of wafer to center of wafer as determined by CV zero bias capacitance. Best wafer had 1% variation of minimum to maximum thickness. Typically, thickness at the edge was 6% lower than the thickness at the center of the wafer.

Fig. 18

Ratio of Al% at edge of wafer to center of wafer. On average, Al% at edge was 99.1% as that at the center of wafer, indicating excellent compositional control.

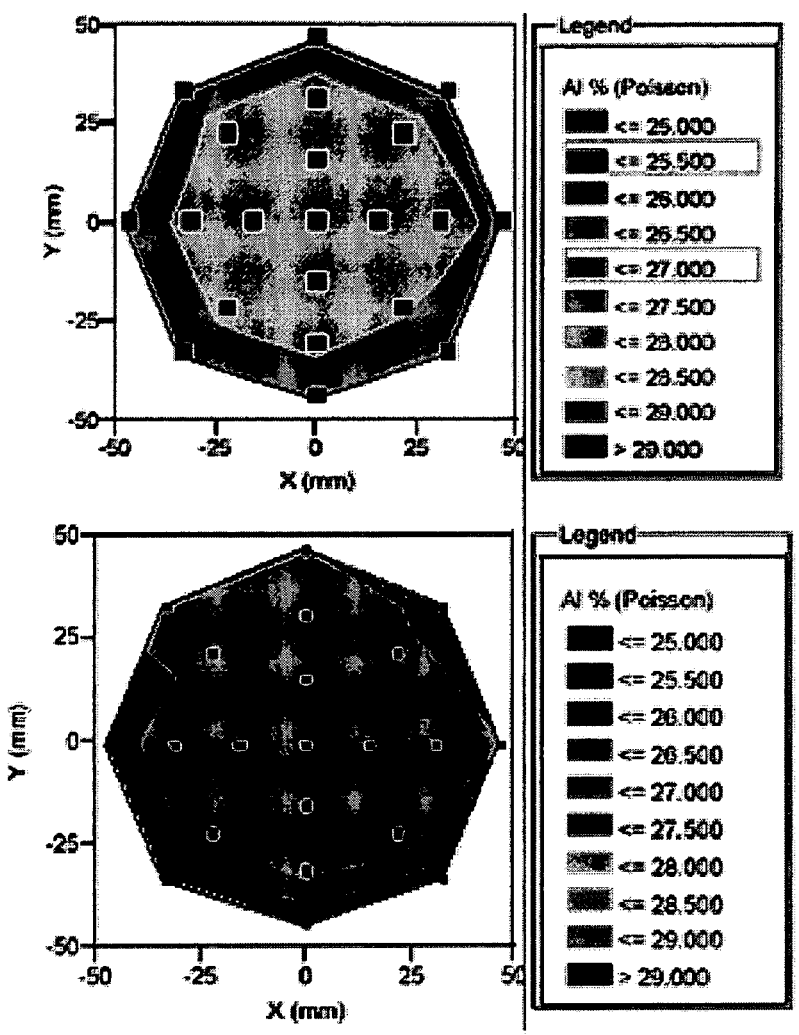
Al mole fraction maps for HEMTs grown on 100 mm HPSI 4H-SiC wafers taken by x-ray diffraction.

Thickness of AlGaN barrier layer for HEMTs grown on 100mm diameter HPSI 4H-SiC substrates measured by x-ray diffraction.

HIGHLY UNIFORM GROUP III NITRIDE EPITAXIAL LAYERS ON 100 MILLIMETER DIAMETER SILICON CARBIDE SUBSTRATES

This invention was developed under Government Contract Nos. N0014-02-C-0321 and N00014-02-C-0306. The Government may have certain rights in this invention.

BACKGROUND

The present invention relates to the use of semiconductor materials for high frequency high-power applications and in particular relates to the use of Group III nitride materials for high electron mobility transistors (HEMTs), and most particularly to improvements in these material systems that lead to corresponding improvements in the electronic performance of the transistors.

A HEMT is a solid-state transistor that offers advantages for signal amplification in applications such as (but not limited to) radar, cellular telephone communications, satellite communications and other microwave circuit applications.

A HEMT behaves much like a conventional Field Effect Transistor (FET). A conducting channel between drain and source electrodes can be affected by applying a voltage to the gate electrode. This modulates the drain-source current. In a HEMT the conducting channel is created by a heterostructure (two different semiconductor materials adjacent one another). The difference between the hetero materials (particularly their respective bandgaps and electron affinities) must be sufficient to encourage the formation of a thin layer of charge carriers at the hetero interface. The thin layer is typically referred to as a two dimensional electron gas ("2DEG"). The concentration of the carriers and their speed in this layer enables the HEMT to maintain a high gain at very high frequencies.

As with other semiconductor devices, many of the performance parameters of any given HEMT are directly related to the material from which it is formed. Gallium arsenide (GaAs), which has become a more standard material for HEMTs, offers a higher electronic mobility (6000 $cm^2$/V-s) and a lower source resistance than silicon and thus provides devices that can function at higher frequencies than comparable silicon-based devices. Nevertheless, gallium arsenide has a relatively small bandgap (1.42 eV) and a relatively small breakdown voltage which limits the higher power, higher frequency applications with which makes gallium arsenide less suitable, or in some cases unsuitable, for higher power, higher frequency applications.

Accordingly, interest in HEMTs has moved to higher bandgap materials such as the Group III nitride material system. Depending upon the particular composition, Group III nitrides can have bandgaps as high as 6 eV (for AlN), and relatively high electron mobility (up to about 2000 $cm^2$/V-s). Perhaps more importantly with respect to the operation of the HEMT, the aluminum gallium nitride based structure can demonstrate a 2DEG sheet density in excess of $10^{13}$ per square centimeter ($cm^{-2}$).

As noted above, the performance of semiconductor devices relates to the materials from which they are formed and the design and quality of particular layers or substrates of those materials. The lack of quality or uniformity in the materials, or in material structures that form devices or device precursors, reduces the yield and limits the sizes of resulting devices that are potentially available from the material systems.

With respect to size, devices built from non-uniform material also show less linearity and greater variation in threshold voltages. Additionally, epitaxial growth normally produces variations in materials (composition and characteristics) across a wafer. These can include differences in concentration of one or more elements (e.g., aluminum in aluminum gallium nitride) and different thicknesses.

To date, higher quality Group III nitride structures are available on two inch and three inch wafers, but these are less advantageous for larger power devices. Additionally, because the edge of every wafer, regardless of size, typically requires about an 8 mm loss, edge losses are proportionally high for smaller wafers. Furthermore, because 100 mm is a common wafer size for other materials (e.g., gallium arsenide), 100 mm wafers with Group III nitride epilayers can be handled by much existing equipment, thus avoiding re-tooling.

Processing costs, however, are typically similar regardless of the size of a wafer so that smaller wafers increase manufacturing costs per device of a given size.

Although larger wafers are thus theoretically desirable, larger wafers are hard to manage because of the increased tendency to bow or warp and because of the typical epitaxial growth characteristics mentioned above.

Therefore, larger size, higher quality, high consistency performance wafers that include Group III nitride heterostructures remain a worthwhile and desired goal in the semiconductor art.

SUMMARY

In one aspect, the invention is a semiconductor precursor structure comprising a silicon carbide single crystal substrate at least 100 millimeters in diameter, a Group III nitride nucleation layer on the substrate, a first Group III nitride epitaxial layer on the nucleation layer, a second Group III nitride epitaxial layer on the first Group III nitride epitaxial layer and having a composition sufficiently different from the composition of the first layer to generate a two-dimensional electron gas at the interface between the first and second layers. A third Group III nitride epitaxial layer may be on the second layer for increasing the electron mobility in the two-dimensional electron gas. The precursor structure has a sheet resistivity standard deviation of no more than about one percent (1%) across the 100 millimeter structure and the precursor structure also has a mobility standard deviation across the 100 millimeter structure of no more than about one percent.

In another aspect, the invention is a method of epitaxial growth of Group III nitride layers on semi-insulating semiconductor substrates using source gases consistent with metal organic chemical vapor deposition (MOCVD). In this aspect, the improvement comprises growing a heterostructure formed from two Group III nitride epitaxial layers that differ sufficiently in composition from one another to generate a two-dimensional electron gas at their interface in a predominantly nitrogen atmosphere and on a substrate that is at least 100 mm in diameter.

In another aspect, the invention is a semiconductor substrate structure comprising a semi-insulating substrate having a diameter of at least 100 mm, a Group III nitride heterostructure on the substrate formed of at least two epitaxial layers that are sufficiently different in composition to generate a two-dimensional electron gas at their interface, a plurality of respective source, drain, and gate contacts in conductive relationship to the heterostructure, with the heterostructure having a sheet resistivity standard deviation of no more than about one percent across the 100 mm substrate and the heterostructure having a mobility standard deviation across the 100 mm substrate of no more than about one percent.

In another aspect, the invention is a semi-insulating silicon carbide wafer having a diameter of at least 100 mm with a Group III nitride heterostructure on the wafer that exhibits high uniformity in a number of characteristics. These include: a standard deviation in sheet resistivity across the wafer less than three percent; a standard deviation in electron mobility across the wafer of between about 0.43 and 0.73 percent; a standard deviation in carrier density across the wafer of no more than about 3.3 percent; a standard deviation in conductivity across the wafer of about 2.5 percent.

In another aspect, the invention is a plurality of semi insulating silicon carbide wafers each having a diameter of at least 100 mm with a Group III nitride heterostructure on each wafer and an aluminum gallium nitride barrier (AlGaN) layer as the top surface of each wafer. In this aspect, 75 percent of the wafers have a ratio of edge to center thickness of the AlGaN barrier layer within 0.08 of 1.00 and a ratio of minimum to maximum percentage of aluminum in the AlGaN barrier layer of between about 0.98 and 1.02; i.e., within 0.02 of 1.00.

The foregoing and other objects and advantages of the invention and the manner in which the same are accomplished will become clearer based on the followed detailed description taken in conjunction with the accompanying drawings.

BRIEF DESCRIPTION OF THE DRAWINGS

FIG. 17 is a chart of sheet resistivity results across several wafers including quantiles.

FIG. 18 is a plot across a plurality of wafers of the ratio of the Group III nitride thickness at the edge of the wafer as compared to the center of the wafer including quantiles.

FIGS. 20 and 21 are aluminum mole fraction maps for transistor precursors grown on 100 millimeter substrates according to the present invention.

DETAILED DESCRIPTION

In one aspect, the present invention is a highly uniform and robust quality aluminum gallium nitride high electron mobility transistor (HEMT) structure formed from 100 millimeter (i.e., slightly smaller than four inch) diameter silicon carbide substrates.

In another aspect, the invention is the highly uniform 100 millimeter diameter wafer precursor upon which individual HEMTs are formed.

In another aspect, the invention is a plurality of HEMTs on a highly uniform 100 millimeter diameter substrate structure.

HEMT precursors according to the invention are formed from epitaxial growth processes that produce heterostructure and related layers that are highly uniform in their physical, chemical and electronic properties. The observed uniformity differences are typically one percent or less, with electron mobility at room temperature greater than 2000 $cm^2/V$-s. These growth techniques result in extremely smooth epitaxial layers, are repeatable, and show resistance improvements in Group III nitride epitaxial layers that in turn improve the electrical characteristics of transistors grown on semi-insulating substrates, particularly semi-insulating silicon carbide substrates. The high uniformity characteristics will be described more fully herein, particularly with respect to the figures.

Figure 1:
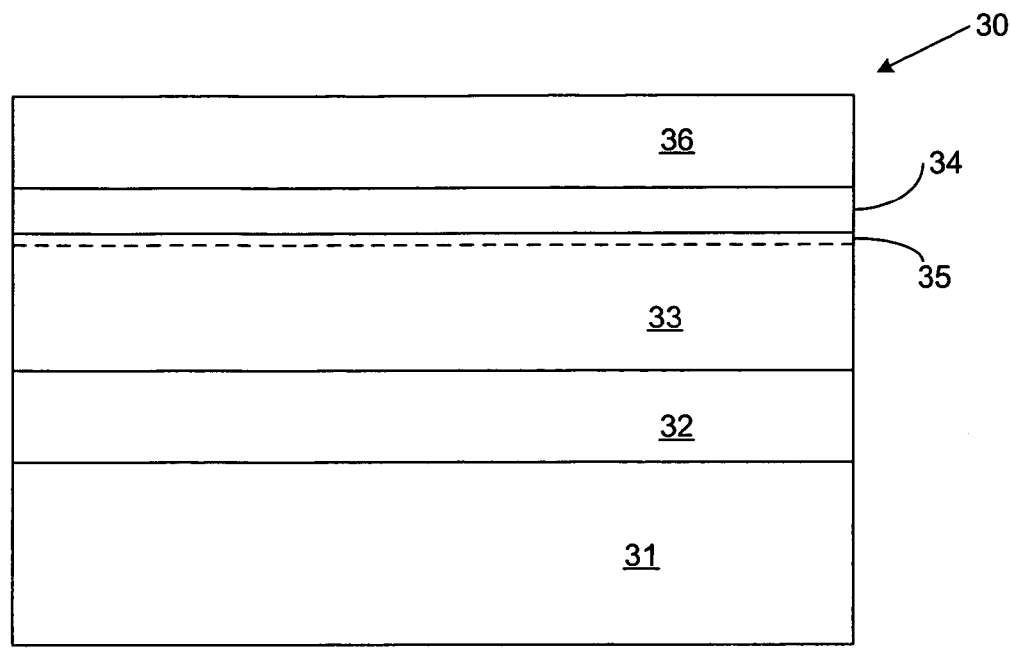
FIG. 1 is a cross sectional schematic view of a semiconductor structure according to the present invention.
Figure 2:
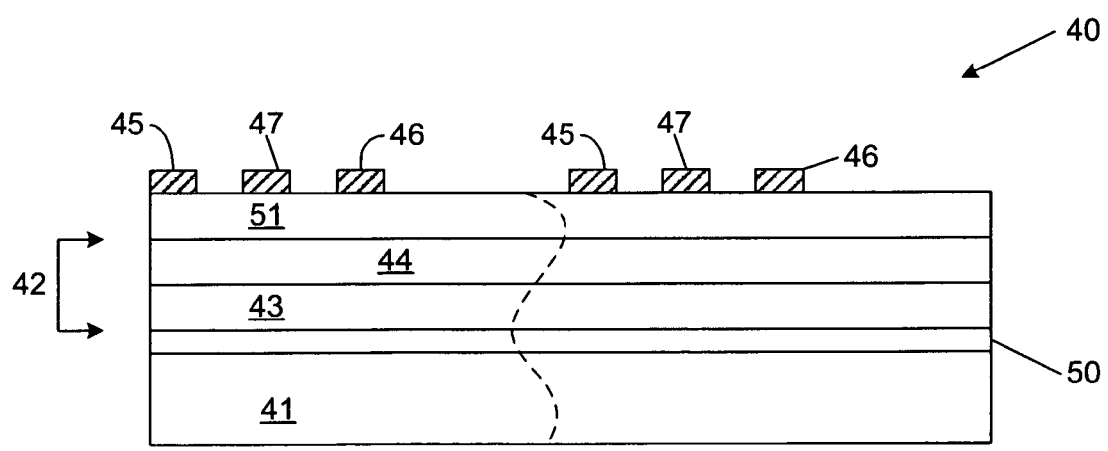
FIG. 2 is a schematic cross-sectional view of a semiconductor wafer with transistor precursors according to the present invention.

As an introduction, FIGS. 1 and 2 present schematic views of the invention. FIG. 1 shows a semiconductor precursor structure broadly designated at 30. The structure includes a substrate 31 that is at least 100 millimeters in diameter and that in exemplary embodiments is formed of semi-insulating silicon carbide in single crystal orientation.

In typical embodiments, a Group III nitride nucleation layer 32 is on and covers the substrate 31. The nucleation layer 32 provides an appropriate growth transition between the substrate 31 and the remainder of the structure. A first Group III nitride epitaxial layer 33 is on the nucleation layer 32 and a second, different composition Group III nitride epitaxial layer 34 is on the first epitaxial layer 33. The compositions of the epitaxial layers 33 and 34—i.e. a heterostructure—have compositions sufficiently different from one another to generate a two dimensional electron gas (2DEG) at the interface between the first and second layers. This gas is schematically illustrated at 35, but it will be understood that FIG. 1 is not drawn to scale and that the 2DEG does not form a physical layer in the same sense as the epitaxial layers 33 and 34.

It will be understood by those familiar with semiconductor devices incorporating Group III nitride layers that the structures described herein are exemplary rather than limiting. Furthermore, the invention described herein can be successfully incorporated with a variety of devices and structures that are different or more elaborate than those specifically described herein. An exemplary group of devices is set forth in the following U.S. patents and U.S. published applications which are incorporated entirely herein by reference: U.S. Pat. Nos. 6,316,793; 6,548,333; 6,849,882; 20020066908; 20030020092; and 20040061129. These are, however, not in any sense limiting of the variety of devices with which the invention could be incorporated.

In many embodiments, a third Group III nitride epitaxial layer 36 is on the second layer 34 for increasing the electron mobility in the two dimensional electron gas.

It will be understood by those of skill in this art that the evaluation of wafers, and of epilayers on wafers, typically excludes a small edge portion. The size of the edge portion depends upon the measurement technique, but for a 100 mm wafer (of any material) will typically total about 5-10 mm (e.g., a perimeter portion about 2.5-5 mm wide). Thus, the measurements set forth herein take edge exclusion into account and describe the wafers and epilayers other than at their respective edge exclusion portions.

This precursor structure is extremely uniform in its physical, chemical, and electronic characteristics. The structure has a sheet resistivity standard deviation of no more than about one percent (1%) across the hundred millimeter structure and the precursor structure likewise has a mobility standard deviation across the 100 millimeter structure of no more than about one percent.

In some embodiments, the structure has a sheet resistivity standard deviation of no more than 0.75% across the 100 millimeter structure and has a mobility standard deviation across the 100 millimeter structure of no more than 0.43%.

In particular embodiments, the silicon carbide single crystal substrate has a polytype selected from the 3C, 4H, 6H, and 15R polytypes of silicon carbide. The nucleation layer 32 is typically selected from the group consisting of aluminum gallium nitride (AlGaN) and aluminum nitride (AlN).

In exemplary embodiments, the first Group III nitride epitaxial layer 33 is gallium nitride, and the second layer 34 comprises aluminum gallium nitride; i.e., $Al_xGa_{1-x}N$ where $0<x\leq 1$. Those familiar with gallium nitride and aluminum gallium nitride will recognize that if x=1, the second Group III nitride epitaxial layer 34 will comprise aluminum nitride; i.e., AlN.

In these exemplary embodiments, the third Group III nitride epitaxial layer similarly comprises aluminum gallium nitride, but having a different atomic fraction (i.e., "x") of aluminum (and therefore of gallium; "1−x") from the second Group III nitride layer 34. In such a structure, the compositional differences between the heterostructure layers (e.g. a GaN layer 33 and an AlGaN layer 34) are sufficient to induce the 2DEG.

Because the heterostructure formed by the epitaxial layers 33 in 34 is useful for high frequency devices, the silicon carbide substrate 31 is typically semi-insulating.

FIG. 2 is a schematic diagram of a semiconductor structure broadly designated at 40 that includes a plurality of HEMT precursors. The structure comprises a semi-insulating substrate 41 having a diameter of at least 100 mm and that in exemplary embodiments is formed of silicon carbide. A Group III heterostructure 42 is on the substrate 41 and is formed of at least two epitaxial layers 43 and 44 that are sufficiently different in composition to generate a two dimensional electron gas at their interface. A plurality of respective source 45, drain 46, and gate 47 contacts are in conductive relationship to the heterostructure 42. As shown in FIG. 2, the conductive relationship between the contacts 45, 46, 47 and the heterostructure 42 can include intermediate layers such as the layer 51 illustrated in FIG. 2.

The heterostructure 42 has a sheet resistivity standard deviation of no more than about one percent across the 100 mm wafer substrate and the heterostructure 42 has a mobility standard deviation across the 100 mm substrate of no more than about one percent.

As illustrated in FIG. 2, in exemplary embodiments the structure 40 includes a Group III nitride nucleation layer 50 on the substrate 41 between the substrate 41 and the gallium nitride layer 43.

In some embodiments, the aluminum gallium nitride layer 44 is unintentionally doped. In such embodiments, the structure 40 may include a doped aluminum gallium nitride layer 51 on the unintentionally doped aluminum gallium nitride layer 44. Alternatively, the layer 51 can comprise a layer of unintentionally doped aluminum gallium nitride as may be desired or necessary for particular applications.

FIG. 2 shows two sets of respective source 45, drain 46, and gate contacts 47, but it will be understood by those familiar with semiconductor manufacturing that a typical 100 mm wafer would include a large plurality, perhaps several hundred, of such contacts defining a similarly large plurality of HEMT precursor structures on the 100 mm wafer. The steps of isolating and separating such devices from one another are generally well understood in this art and will not be repeated in detail herein.

The invention in particular offers performance and quality advantages over analogous structures available to date.

Accordingly, in another aspect the invention is a semiconductor structure comprising a semi-insulating silicon carbide wafer having a diameter of at least 100 mm, a Group III nitride heterostructure on the wafer, and the wafer and the heterostructure demonstrating a standard deviation in sheet resistivity across the wafer of less than three percent (3%), in many embodiments less than 2.7%, and in some embodiments as low as 1.3%.

Such embodiments have demonstrated these characteristics over an appropriate range of conductivities, such as in conjunction with an average sheet resistivity of about 450 ohms per square as well as in conjunction with a sheet resistance of between about 342 and 356 ohms per square.

In yet other embodiments, the wafer and the heterostructure demonstrate a standard deviation in sheet resistivity uniformity across the wafer of between about 0.75 and 1.23 percent with an average sheet resistivity of between about 293 and 311 ohms per square and a maximum sheet resistivity of no more than 329 ohms per square In yet another aspect, the invention is a semiconductor structure comprising a semi insulating silicon carbide wafer having a diameter of at least 100 mm, a Group III heterostructure on the wafer, and the wafer and a heterostructure demonstrating a standard deviation in electron mobility across the wafer of between about 0.43 and 0.73 percent. In this aspect, wafers tested have demonstrated electron mobility of between about 2017 and 2052 $cm^2/V$-s and in other embodiments between about 2061 and 2081 $cm^2/V$-s at room temperature.

In yet another aspect, the invention is a semiconductor structure comprising a semi-insulating silicon carbide wafer having a diameter of at least 100 mm, a Group III nitride heterostructure on the wafer, and the wafer and the heterostructure demonstrating a standard deviation in carrier density across the wafer of about 3.3 percent. In particular, structures according to this embodiment have demonstrated these results with a carrier density of between about $8.2\times10^{12}$ (8.2E12) and $8.9\times10^{12}$ (8.9E12) per square centimeter ($cm^-2$).

In yet another aspect, and because conductivity is the inverse of resistivity, the invention is a semiconductor structure comprising a semi-insulating silicon carbide wafer having a diameter of at least 100 mm, a Group III nitride heterostructure on the wafer, and the wafer and the heterostructure demonstrating a standard deviation in conductivity across the wafer of about 2.5 percent. Wafers evaluated in this context, have also demonstrated a conductivity of between about $2.69\times10^{-3}$ and $2.86\times10^{-3}$ mhos.

As illustrated in FIG. 18, in another aspect the invention can be described as a plurality of semi-insulating silicon carbide wafers each having a diameter of at least 100 mm with a Group III nitride heterostructure on each of the wafers and an aluminum gallium nitride barrier layer as the top surface of each of the wafers, and with 75 percent of the wafers having a ratio of edge to center thickness of the aluminum gallium nitride barrier layer of at least 0.92. As set forth in the figures, these results have been determined for pluralities of at least 10 wafers and in some cases at least 15 wafers. In this context, 50 percent of the wafers have a ratio of edge to center thickness of the AlGaN layer of at least 0.94 and 25 percent have a ratio of edge to thickness center of the AlGaN layer of at least 0.95.

In another aspect (FIG. 19), and again considering the consistency from wafer to wafer, the invention is a plurality of semi-insulating silicon carbide wafers each having a diameter of at least 100 mm with a Group III nitride heterostructure on each wafer and an aluminum gallium nitride barrier layer as the top surface of each wafer. In this aspect, the wafers have a ratio of edge to center percentage of aluminum in the aluminum gallium nitride barrier layer of between about 0.98 and 1.02; i.e., they exhibit high uniformity across the wafer in contrast to many empirical prior results for chemical vapor deposition growth.

Figure 19:
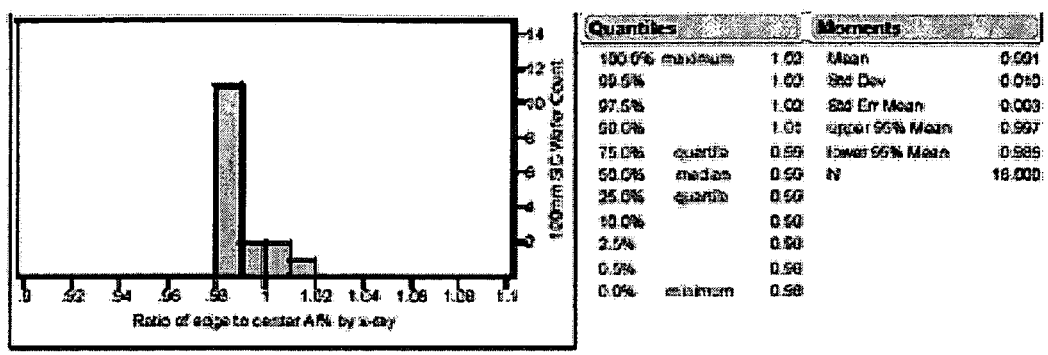
FIG. 19 is a bar graph and quantiles similar to FIG. 18, but expressing the ratio of the percentage of aluminum at the edge of the wafer to the center of the wafer.

As indicated in FIG. 19, these results can be maintained across a plurality of at least 10 wafers and in many cases across at least a plurality of at least 15 wafers. Expressed in similar terminology, the invention can include a plurality of at least 10 of the wafers wherein at least 75 percent of the wafers have a ratio of edge to center percentage of aluminum in the aluminum gallium nitride barrier layer of 0.99.

Figure 3:
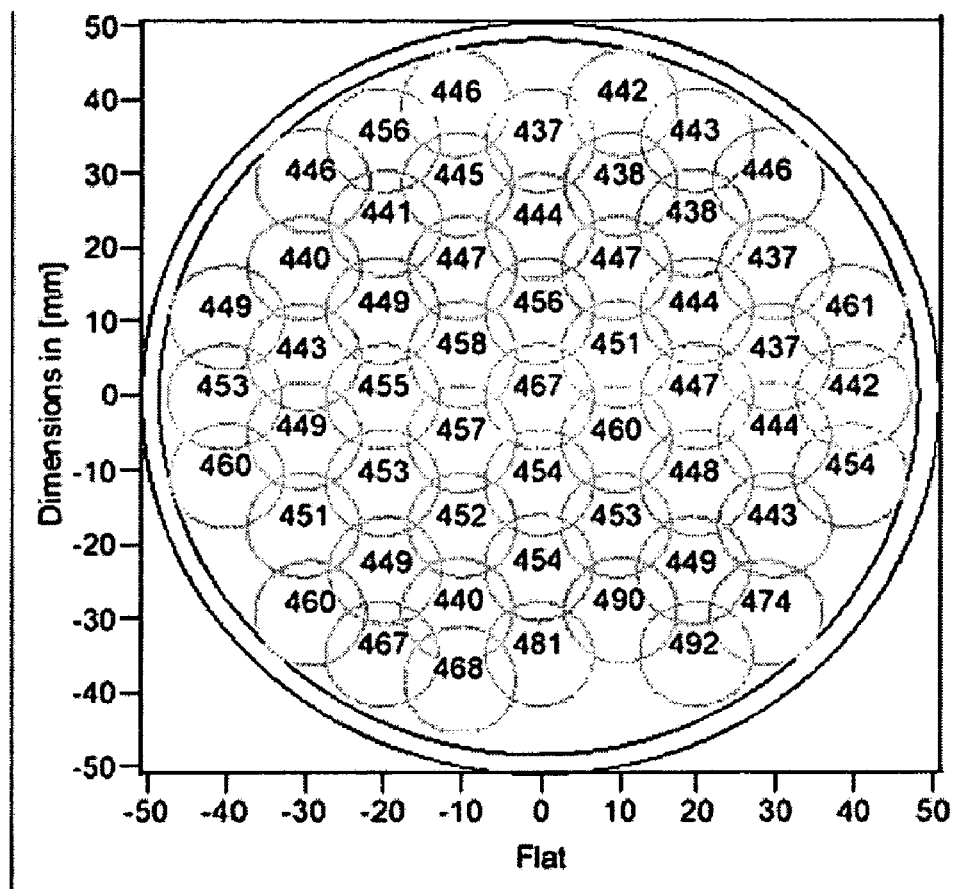
FIG. 3 is a sheet resistance map for a wafer according to the present invention.
Figure 5:
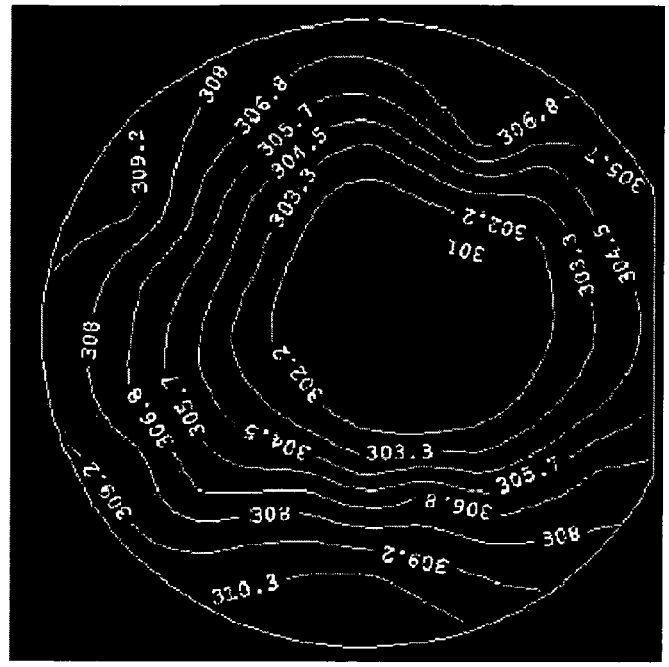
FIGS. 4 through 11 are sheet resistance contour maps for wafers according to the present invention.
Figure 4:
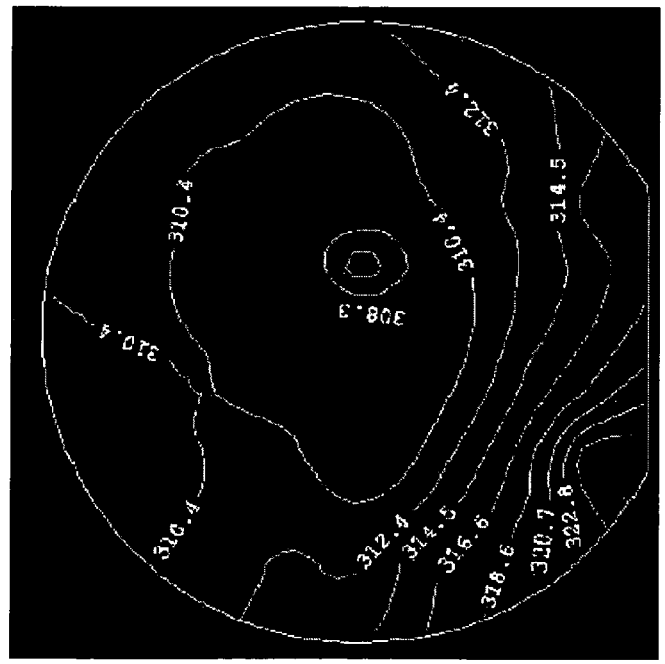
Figure 7:
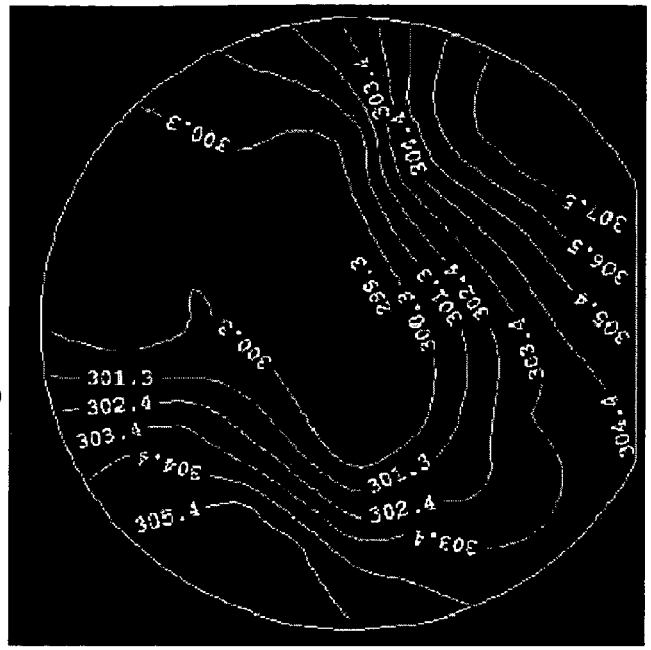
Figure 6:
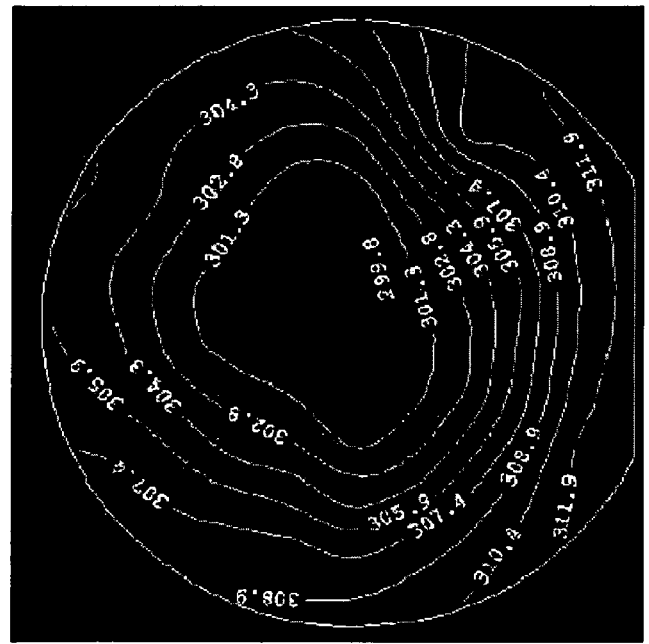
Figure 9:
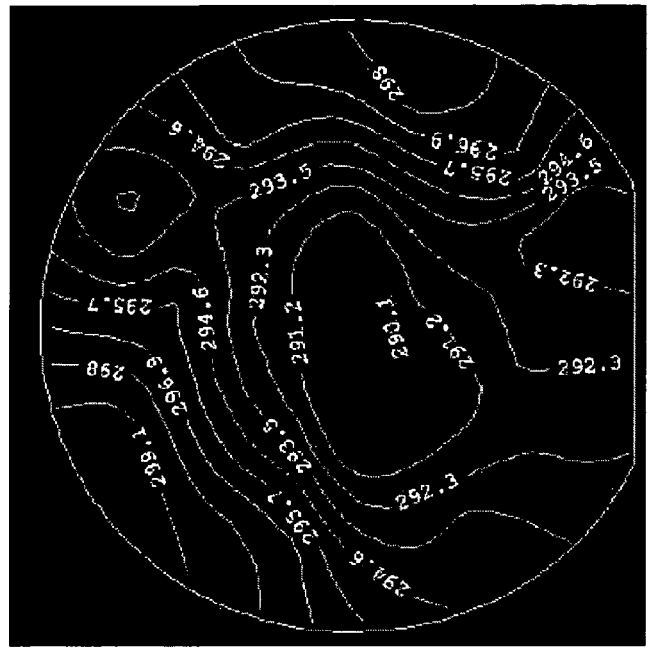
Figure 8:
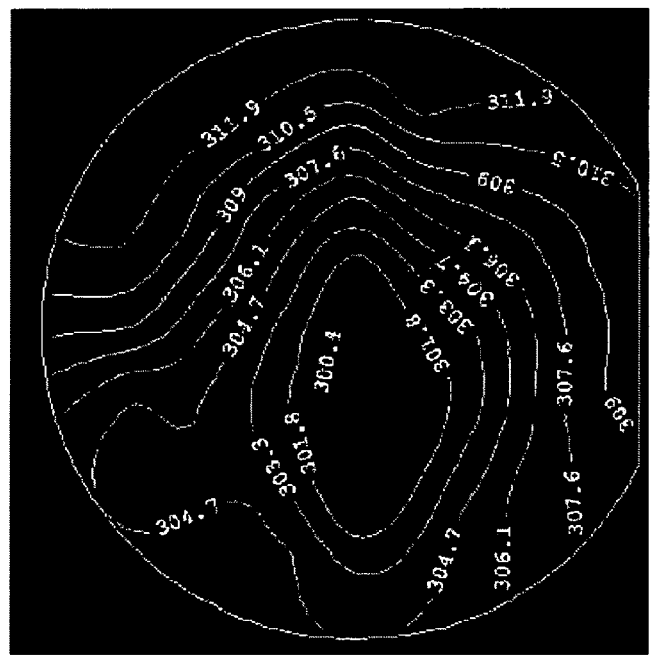
Figure 11:
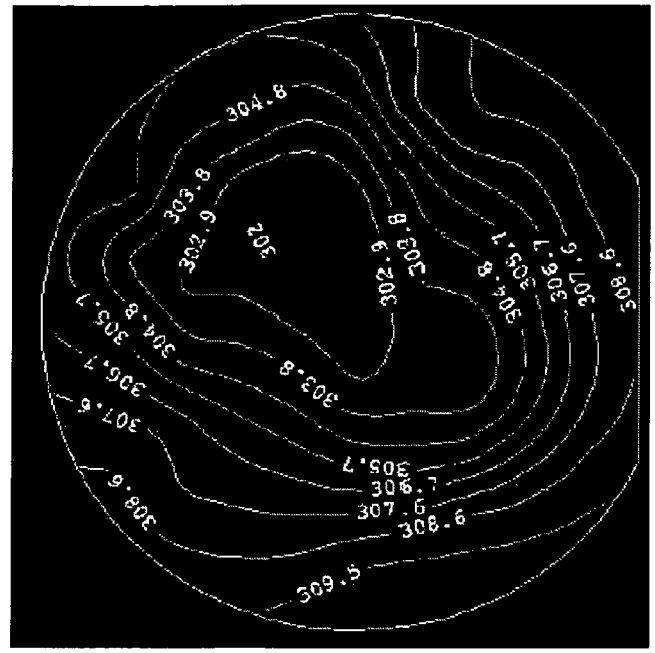
Figure 10:
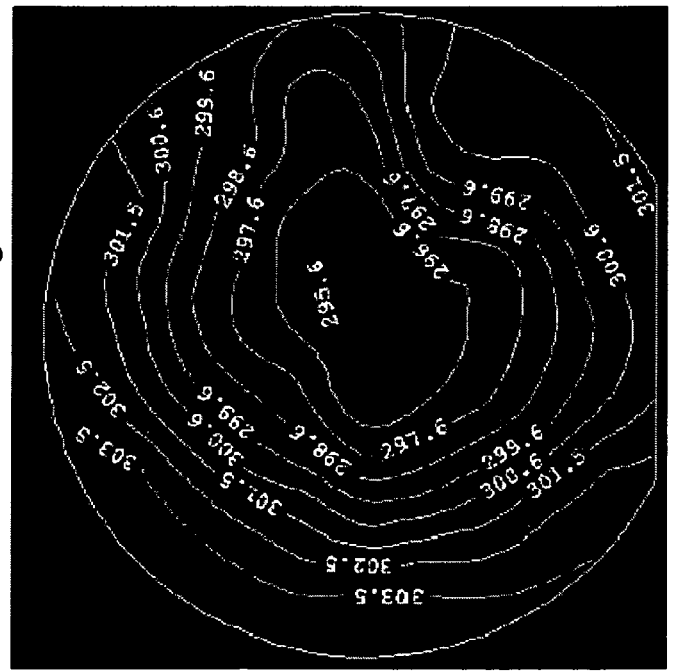

FIG. 3 is a sheet resistance uniformity plot for a 100 millimeter (4") semi-insulating 4H silicon carbide wafer. The average uniformity was 452 ohms per square over the 90 percent usable area of the 100 millimeter wafer. Individual measurements are indicated as the numbers within the wafer circle and were measured using a Lehighton Model 1510 device from Lehighton Electronics, Inc. of Lehighton, Pa., USA.

FIGS. 4 through 11 are sheet resistivity contour maps for wafers according to the present invention; each accompanied by the statistical summary for the illustrated wafer. The sheet resistivity was also measured on a Lehighton Model 1510 device. As illustrated in FIGS. 4-11, the largest standard deviation expressed as a percentage is 1.23 percent, with some values being as low as 0.75 percent thus illustrating the high uniformity provided by the invention.

Figure 12:
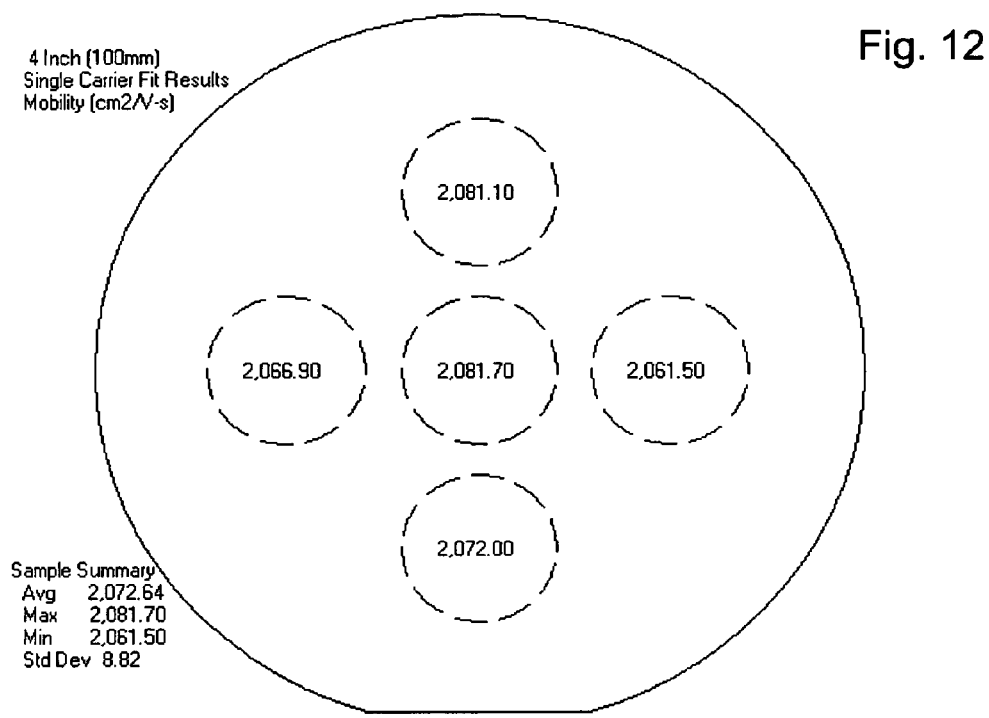
FIGS. 12-16 are point data for various electronic characteristics of wafers according to the present invention.
Figure 13:
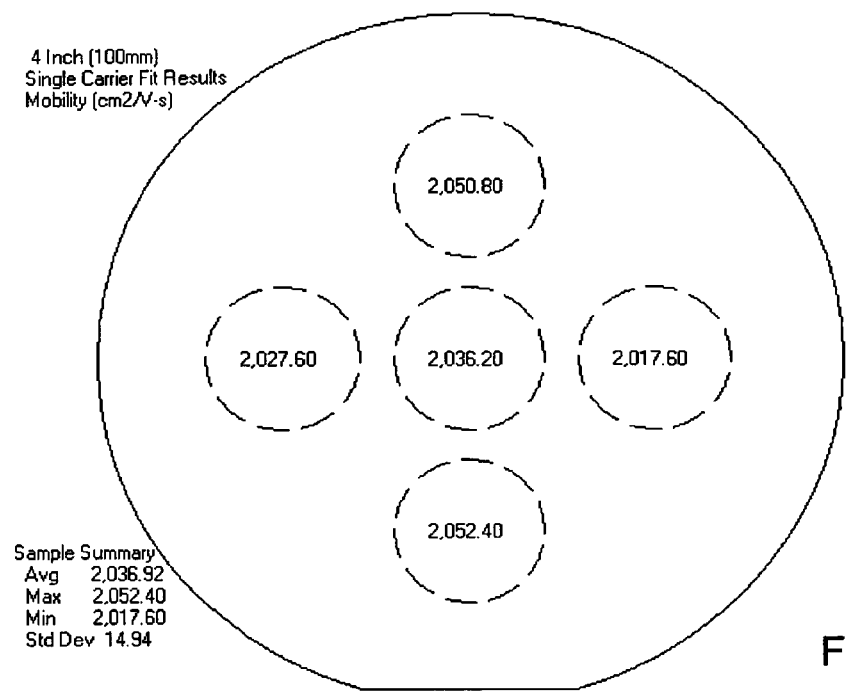

FIGS. 12 and 13 are plots of mobility data on HEMT structures grown on 100 millimeter diameter high purity semi insulating (HPSI) 4H—SiC substrates according to the invention. These were measured at the five-points indicated in each of FIGS. 12 and 13 using the Lehighton Model 1610 instrument. In each case, the mobility exceeded 2000 $cm^2$/V-s with a standard deviation well under 1%. The carrier concentration for the wafers in FIGS. 12 and 13 was $0.9 \times 10^{13}$ per square centimeter ("0.9E13 $cm^{-2}$" and expressed as one significant figure).

Figure 14A:
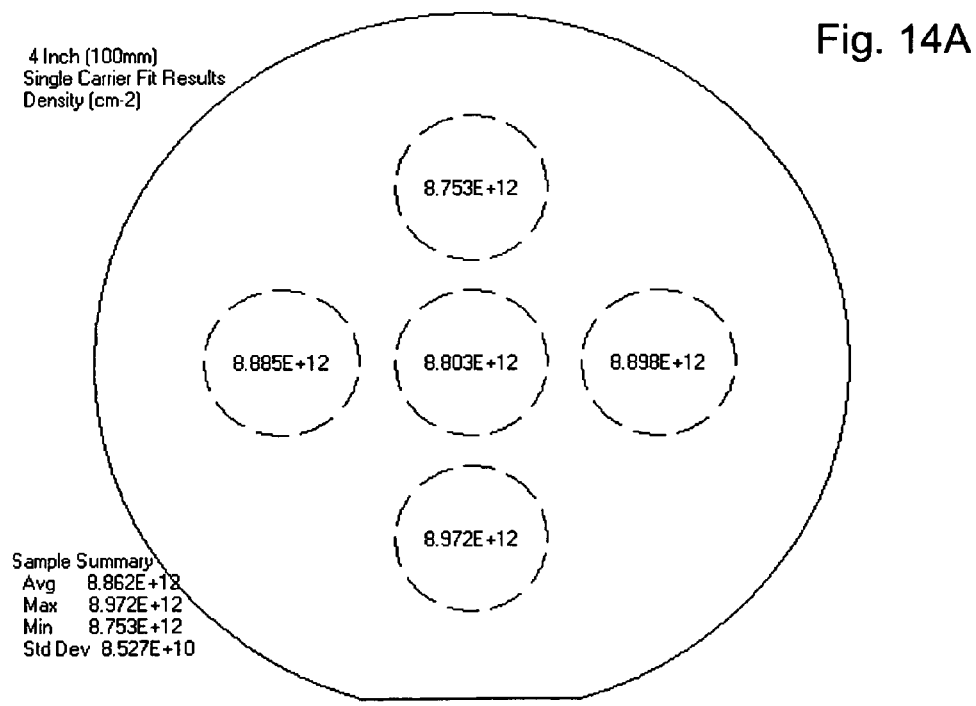
Figure 14:
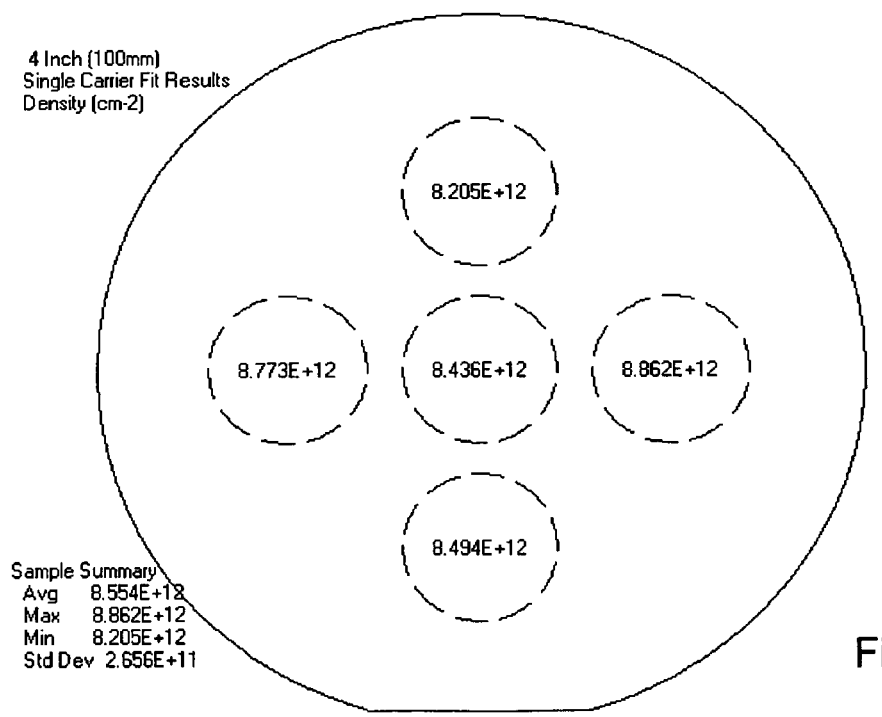

FIG. 14 is a plot of carrier concentration ("Density") for a wafer according to the present invention and showing a standard deviation expressed as a percentage of about 3.1 percent.

Figure 15:
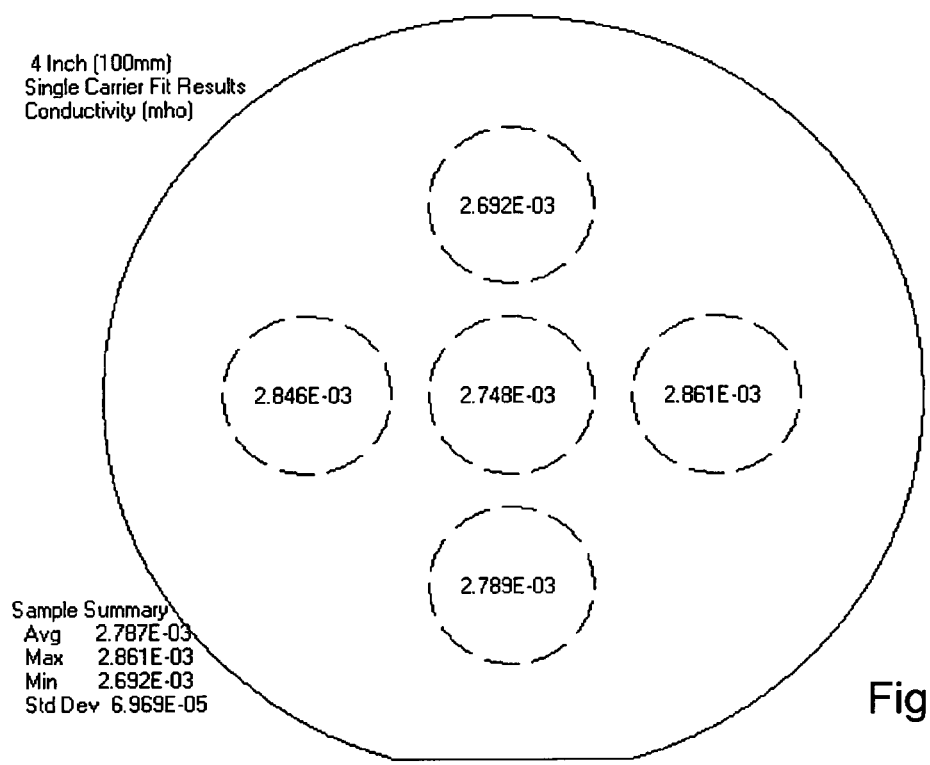

FIG. 15 is a plot of conductivity (mhos) for a wafer structure according to the present invention and showing a standard deviation expressed as a percent of about 2.5 percent.

Figure 16:
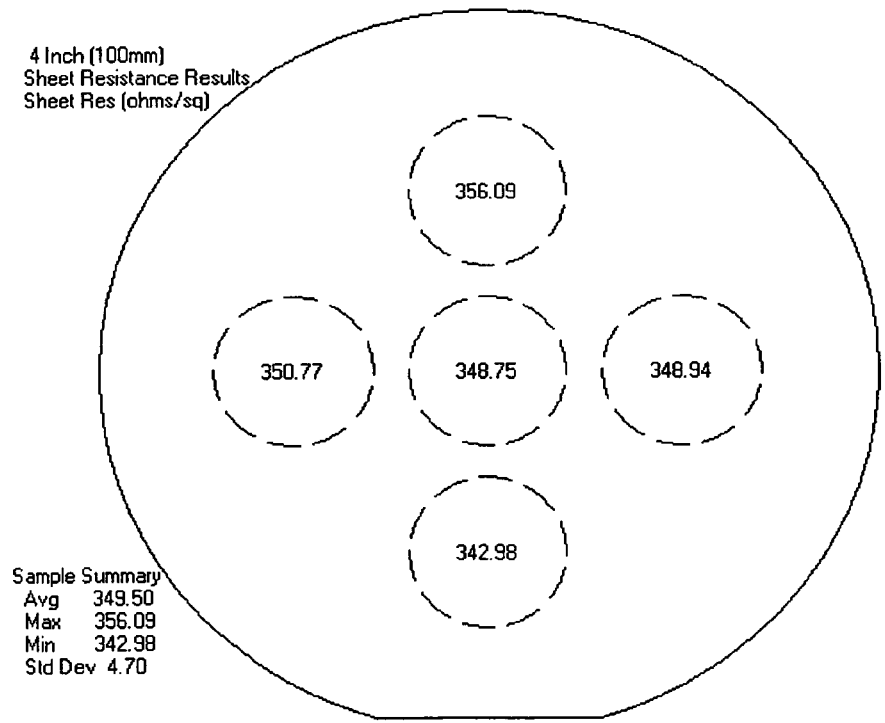

FIG. 16 is a plot of the sheet resistance measured on a wafer according to the present invention and showing a standard deviation expressed as a percentage of about 1.3 percent.

Figure 15A:
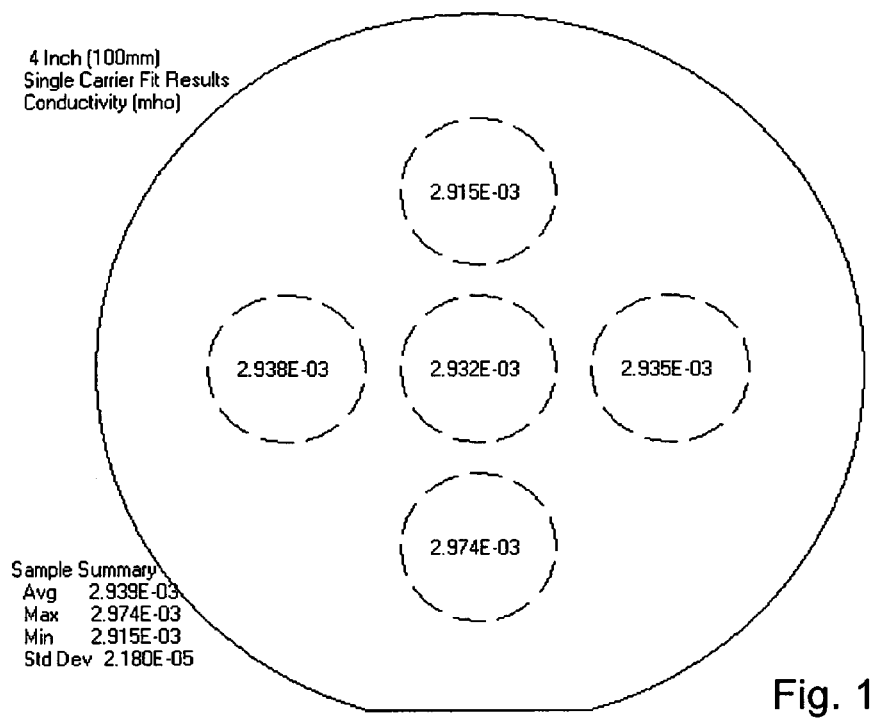
Figure 16A:
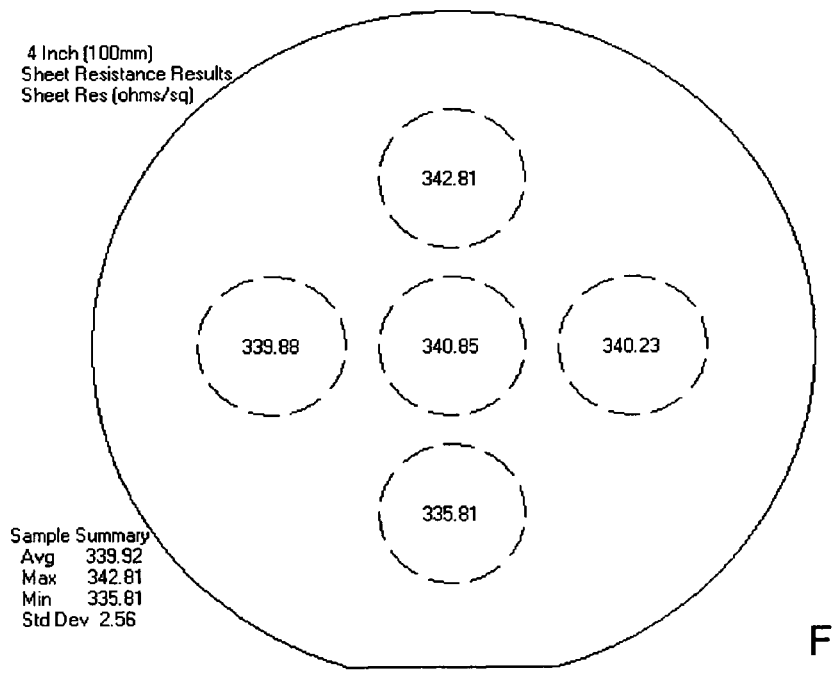

In a corresponding manner FIG. 14A illustrates carrier density results with a standard deviation of only 0.96%; FIG. 15A illustrates conductivity results with a standard deviation of only 0.74%; and FIG. 16A illustrates sheet resistance results with a standard deviation of only 0.75%.

The data underlying several of the Figures is set forth in the following tables:

Lehighton 1610 Summary Report
100 mm Sample Size

| Position | Mobility (cm2/V-s) | Density Ns (cm−2) | Conductivity (mho) | Sheet Res. (ohm/sq.) |
|---|---|---|---|---|
| Center | −2081.70 | −8.803E+12 | 2.932E−03 | 340.85 |
| 1/2 Rad Top | −2081.10 | −8.753E+12 | 2.915E−03 | 342.81 |
| 1/2 Rad Bottom | −2072.00 | −8.972E+12 | 2.974E−03 | 335.81 |
| 1/2 Rad Left | −2066.90 | −8.885E+12 | 2.938E−03 | 339.88 |
| 1/2 Rad Right | −2061.50 | −8.898E+12 | 2.935E−03 | 340.23 |
| Maximum | 2081.70 | 8.972E+12 | 2.974E−03 | 342.81 |
| Minimum | 2061.50 | 8.753E+12 | 2.915E−03 | 335.81 |
| Average | 2072.64 | 8.862E+12 | 2.939E−03 | 339.92 |
| STD Dev. | 8.82 | 8.527E+10 | 2.180E−05 | 2.56 |

Sheet Resistivity

| Wafer | Average (ohms/square) | Standard Deviation | Percent Standard Deviation |
|---|---|---|---|
| 1 | 311.5 | 3.8 | 1.22 |
| 2 | 304.5 | 2.9 | 0.95 |
| 3 | 304.4 | 3.6 | 1.18 |
| 4 | 302.1 | 2.6 | 0.86 |
| 5 | 305.8 | 3.7 | 1.21 |
| 6 | 293.6 | 2.7 | 0.92 |
| 7 | 299.2 | 2.4 | 0.80 |
| 8 | 305.4 | 2.3 | 0.75 |

Sheet Resistance

| Wafer | Average (ohms/square) | Standard Deviation | Percent Standard Deviation |
|---|---|---|---|
| 1 | 349.5 | 4.7 | 1.34 |
| 2 | 339.92 | 2.56 | 0.75 |

Mobility

| Wafer | Average ($cm^2$/V-s) | Standard Deviation | Percent Standard Deviation |
|---|---|---|---|
| 1 | 2037 | 14.9 | 0.73 |
| 2 | 2073 | 8.8 | 0.43 |

FIG. 17 is a graph, accompanied by quantiles, plotting the sheet resistivity standard deviation of 18 wafers according to the present invention. FIG. 17 includes experimental epitaxial growth in substrates with large defects, thus moving the data toward higher (less uniform) values. Stated differently, even when the less favorable samples are included, the higher quality of the present invention is clearly set forth.

FIG. 18 is a plot, also with listed quantiles, of the ratio of the AlGaN barrier thickness at the edge of the wafer to the center of the wafer as determined by CV zero bias capacitance for 16 wafers according to the present invention. As set forth therein, the best wafer had a 1% variation between minimum and maximum thickness, and typically the thickness at the edge of the wafer was 6% lower than the thickness at the center of the wafer.

FIG. 19 is a plot accompanied by quantiles of the ratio of the percentage of aluminum measured at the edge of the wafer to the center of the wafer for 16 wafer samples according to the present invention. On average, the percentage of aluminum measured at the edge was 99.1 percent of the percentage at the center of the wafer demonstrating excellent compositional control. As noted earlier, a small edge portion is excluded when making these measurements.

FIGS. 20 and 21 are aluminum mole fraction maps taken by x-ray diffraction for HEMTs grown on 100 mm HPSI 4H—SiC wafers according to the present invention.

Figure 22:
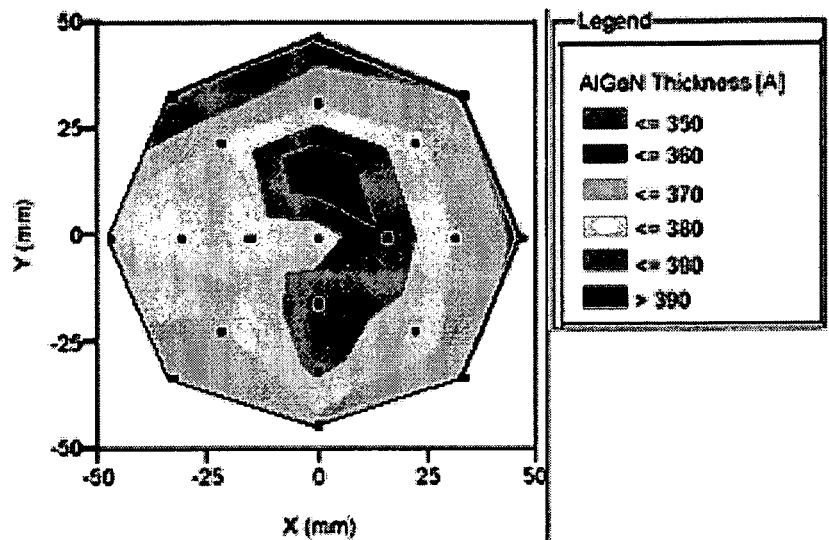
FIGS. 22 and 23 are plots of the thickness of the Group III nitride barrier for transistors grown on 100 millimeter substrates according to the present invention.
Figure 23:
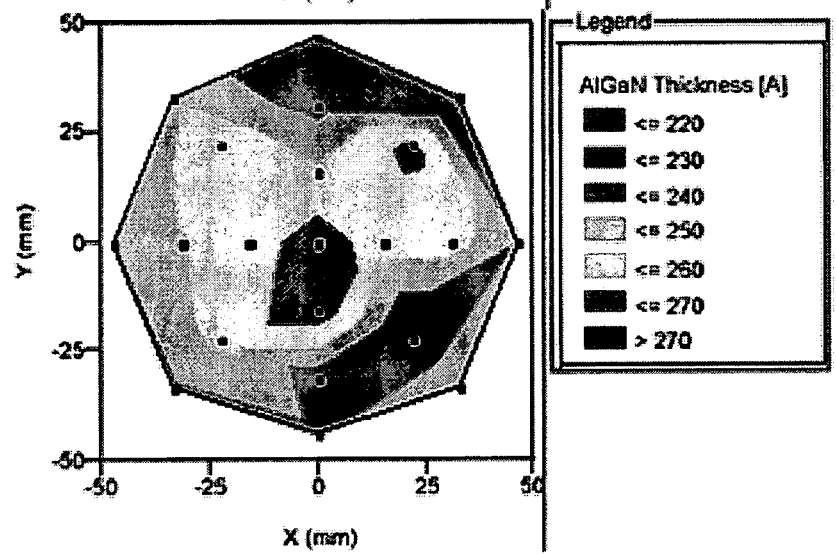

FIGS. 22 and 23 are surface map plots of the thickness of the AlGaN barrier layer for HEMTs grown on 100 millimeter diameter HPSI 4H-SiC substrates according to the present invention as likewise measured by x-ray diffraction.

Figure 24:
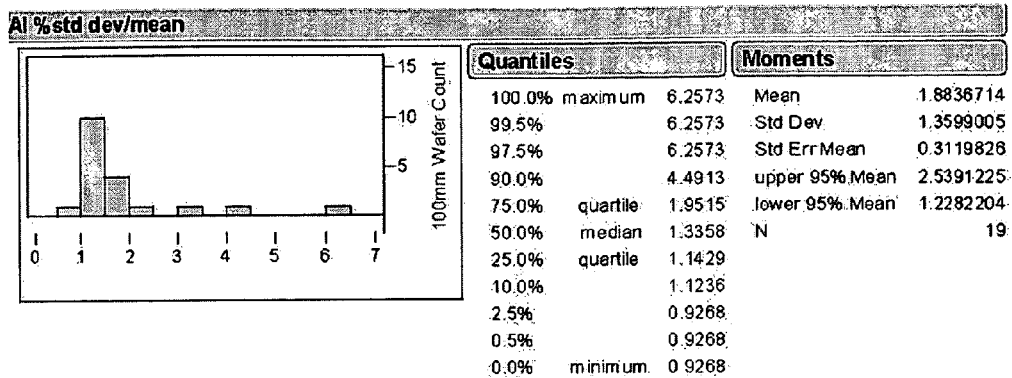
FIG. 24 is a bar graph of wafer count versus percent standard deviation of aluminum.

In another aspect, the invention is a semiconductor structure comprising an epitaxial layer of Group III nitride containing aluminum on a compatible substrate. The Group III nitride layer has a diameter of at least 100 millimeters and demonstrates a standard deviation in aluminum content of less than 1.36 percent. This aspect of the invention is illustrated in the bar chart and associated statistics set forth in FIG. 24. As shown therein, in addition to the low standard deviation in aluminum content, when a plurality of the wafers are considered together, at least 75 percent of the wafers have a deviation in aluminum content of their respective Group III nitride layers of 1.95 percent or less. FIG. 24 illustrates a plurality of at least 15 wafers with these characteristics demonstrating the consistency and precision provided by the present invention.

Figure 25:
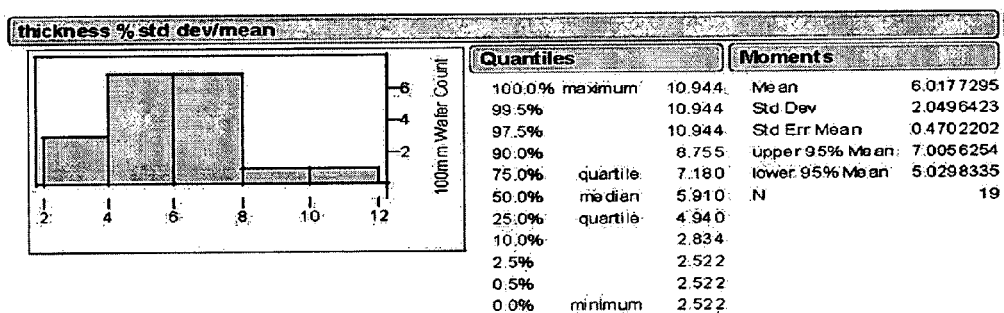
FIG. 25 is a bar graph of wafer count versus percent standard deviation in thickness.

In another aspect, the invention is a semiconductor structure of an epitaxial layer of Group III nitride containing aluminum on a compatible substrate that has a diameter of at least 100 millimeters. The Group III nitride layer demonstrating a standard deviation in thickness of less than 2.1 percent. FIG. 25 also illustrates these beneficial characteristics in terms of a plurality of wafers. As indicated in FIG. 25, at least 75 percent of a plurality of these wafers have a deviation in thickness of their respective Group III nitride layer of less than 7.2 percent. In particular, FIG. 25 illustrates this consistency across a plurality of at least 15 wafers.

These measurements were taken using x-ray diffraction, and the statistical terms are used in their conventional sense.

A number of background aspects of the growth of Group III nitride layers on silicon carbide substrates are generally well understood in the art and can be practiced by those of ordinary skill in this art without undue experimentation. As a specific discussion, however, the structures shown herein were typically grown using metal organic chemical vapor deposition (MOCVD). As further background, a discussion of the growth of related materials on sapphire substrates is set forth in Keller, *Effect of growth termination conditions on the performance of AlGaN/GaN high electron mobility transistors*, APPLIED PHYSICS LETTERS, Vol. 70, No. 20, May 14, 2001, pp 3088-90. The high uniformity obtained in the invention is also possible using related techniques such as metal-organic vapor phase epitaxy (MOVPE) or molecular beam epitaxy (MBE), although material produced by MOCVD generally costs less than material produced by MBE and MOCVD tends to produce a higher quality Group III-Nitride material (for example lower dislocation density).

In the invention, trimethyl gallium (($CH_3)_3$Ga; "TMG") and trimethyl aluminum (($CH_3)_3$Al; "TMA") were used as the Group III precursors and ammonia ($NH_3$) was used as the nitrogen precursor. As a particular improvement, however, it has been discovered according to the present invention that the best results appear to be obtained when the AlN and AlGaN layers are grown in an atmosphere containing minimal (about 5 percent) hydrogen ($H_2$), such as an atmosphere that is predominantly nitrogen ($N_2$).

When an n-type AlGaN layer is desired, it is typically doped with silicon using silane ($SiH_4$) as the precursor gas.

In forming the structures illustrated and described herein, the layers are typically grown at temperatures of about 1000° C.

As another factor addressed by the present invention, epitaxial layers can cause bow or warp or both in substrates resulting from the stress present in the deposited films, or in some cases the stress present in the substrates. The terms bow and warp are used herein in a manner that is well understood in this art and for which appropriate definitions are available from established sources (e.g., SEMI; www.semi.org). Bow or warp are generally undesirable when processing wafers as either may be sufficient to preclude later flattening by appropriate tools such as steppers. Additionally, warp and bow can prevent uniform contact with hot surfaces during annealing or baking steps. As another problem, wafer breakage and loss can occur because vacuum tools may tend to drop wafers that are bowed or warped. As another problem, wafers are often thinned for further processing, for example making vias. In such thinning steps, wafer shape problems become even more severe. Thus, low strain epitaxial layers and resulting flat wafers are highly desirable.

The fabrication of Group III nitride (also referred to as "III-V") epitaxial layers may be controlled to control the strain in the layer and help minimize or eliminate bow and warp. For example, the III-V ratio and/or the pressure under which a III-V epitaxial layer is fabricated may be controlled to control the strain in the III-V epitaxial layer. By increasing the V/III ratio, the III-V layer may be made more compressive. Furthermore, by fabricating the III-V epitaxial layer at lower pressures the III-V epitaxial layer may be more compressive. Additionally, as the thickness of the III-V epitaxial layer increases, an otherwise compressive strained layer may become tensile strained. Such tensile strain may result in defects, such as cracking, of the III-V epitaxial layer. Accordingly, the thickness, growth conditions and source materials may be controlled to avoid changes in the strain of the III-V epitaxial layer during fabrication.

Control of a GaN/AlN nucleation conditions to control the initial strain through island growth and coalescence may also be used to control the strain of a GaN epitaxial layer. For example, the pressure and $NH_3$ flow rates may be adjusted to reduce and/or control strain and bow resulting from the growth of a GaN epitaxial layer.

Other techniques for stress control are set forth in commonly assigned U.S. Pat. No. 6,841,001; the contents of which are incorporated entirely herein by reference.

Figure 26:
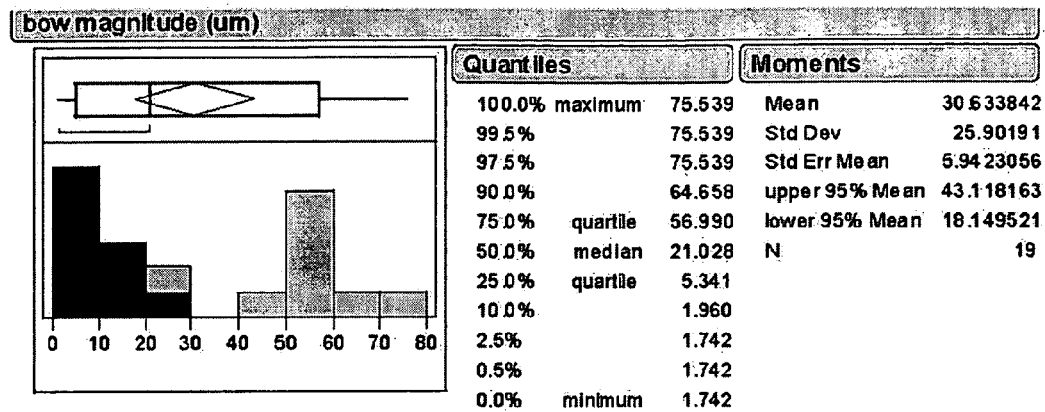
FIG. 26 is a bar graph of wafer count versus bow magnitude in microns.
Figure 27:
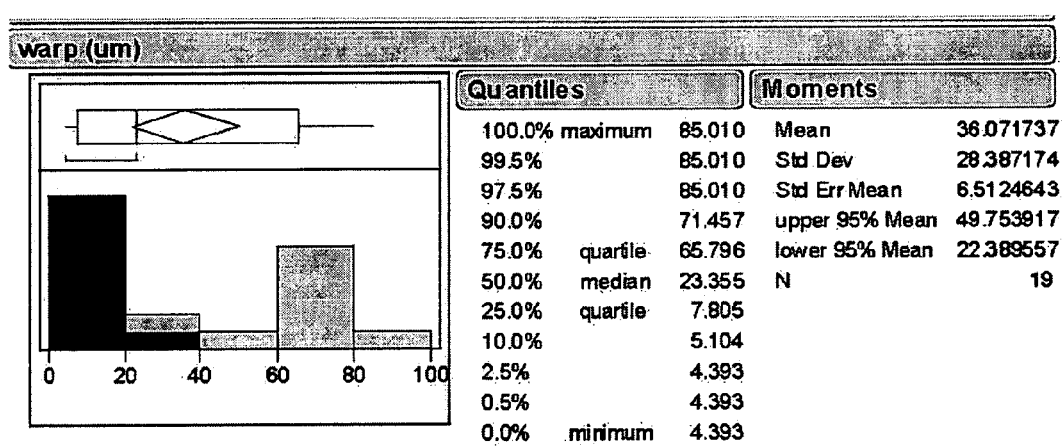
FIG. 27 is a bar graph of wafer count versus warp in microns.

FIGS. 26 and 27 illustrates the favorable (i.e., minimal) bow and warp characteristics of wafers according to the present invention. FIG. 26 is a plot of bow magnitude in microns versus wafer count and illustrates that for these 100 millimeter wafers, the mean (average) bow is less than 31 microns, with a standard deviation of less than 26 microns. When viewed as a plurality, at least 75 percent of a group of such 100 millimeter wafers have a bow of less than 57 microns.

FIG. 27 illustrates similar results in terms of warp. As set forth therein, for a plurality of at least 15 wafers, the mean warp was less than 37 microns with a standard deviation of less than 29 microns. At least 75 percent of the 100 millimeter wafers have a warp of less than 66 microns.

For thick films (e.g., about 6 microns of Group III nitride), bow magnitude as low as 24 microns and a total warp as low as 28 microns was achieved by intentionally reducing the compressive strain by controlling the initial gallium nitride growth conditions on an aluminum nitride nucleation layer. For thinner films (e.g., about 2 microns of Group III nitride), bow magnitude as low as 2 microns and a total warp of 5 microns was achieved by intentionally reducing the compressive strain by controlling the initial gallium nitride growth conditions on an aluminum nitride nucleation layer. In obtaining these results, the 100 millimeter diameter silicon carbide substrates used were approximately 0.6 millimeters thick.

Accordingly, in another aspect the invention is a 100 millimeter or a larger silicon carbide wafer with one or more Group III nitride layers deposited on it with a warp of less than 100 microns. In particular embodiments, the silicon carbide wafer can be less than 1 millimeter thick and the total nitride layer (or layers) thickness greater than 1 micron. In other embodiments, the wafer and layer exhibit a warp of less than 50 microns, in other embodiments less than 25 microns, in other in embodiments less than 10 microns, and in some embodiments less than five microns.

In another aspect, the invention is a 100 millimeter or larger silicon carbide wafer with a Group III nitride layer (or layers) deposited on it with a bow of less than 100 microns. In exemplary embodiments the silicon carbide wafer is less than 1 millimeter thick and the Group III nitride layer (or layers) is more than 1 micron thick. In other embodiments the wafer and deposited epitaxial layer exhibit a bow of less than 50 microns, in other embodiments less than 25 microns, in other embodiments less than 10 microns, and in some embodiments less than 5 microns.

In particular, wafers and deposited epitaxial layers with bow less than 25 microns can be accomplished with the silicon carbide wafer being less than 1 millimeter thick and the nitride layer being more than 5 microns thick. In some embodiments, the wafer and a deposited epitaxial layer with less than 5 microns of bow can be accomplished on wafers in which the silicon carbide is less than 1 millimeter thick and the total nitride thickness is greater than 1 micron. In general, for a film with a given amount of stress, wafer bow increases with wafer diameter and film thickness, and decreases with substrate thickness.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A semiconductor structure comprising:
   a silicon carbide substrate wafer having a diameter of at least 100 mm;
   a Group III nitride heterostructure on said substrate wafer; and
   said heterostructure demonstrating a standard deviation in sheet resistivity across said wafer of less than 3%.

2. A semiconductor structure according to claim 1 wherein said silicon carbide is semi-insulating.

3. A semiconductor structure according to claim 1 demonstrating a standard deviation in sheet resistivity uniformity across said wafer of less than about 0.75%.

4. A semiconductor structure according to claim 1 wherein said substrate wafer and heterostructure demonstrate an average sheet resistivity of about 450 ohms per square.

5. A semiconductor structure according to claim 1 demonstrating a sheet resistance of about 350 ohms/square.

6. A semiconductor structure according to claim 1 with an average sheet resistivity of about 300 ohms/square.

7. A semiconductor structure according to claim 1 with a maximum sheet resistivity no more than 329 ohms per square.

8. A semiconductor structure according to claim 1 wherein said heterostructure includes an aluminum gallium nitride epitaxial layer above said substrate wafer; said aluminum gallium nitride layer having a sheet resistivity standard deviation of no more than about 1.5 percent across the 100 millimeter structure.

9. A semiconductor precursor structure according to claim 8 wherein said aluminum gallium nitride layer has a sheet resistivity standard deviation of no more than about 1.0 percent across the 100 millimeter structure.

10. A semiconductor structure according to claim 1 wherein said Group III heterostructure is formed of at least two epitaxial layers that are sufficiently different in composition to generate a two dimensional electron gas at their interface;
   said structure further comprising a plurality of respective source, drain and gate contacts in conductive relationship to said heterostructure.

11. A semiconductor structure according to claim 10 wherein said heterostructure has a sheet resistivity standard deviation of no more than about one percent across the 100 mm substrate.

12. A semiconductor structure according to claim 10 wherein said heterostructure has a mobility standard deviation across the 100 mm substrate of no more than about one percent.

13. A semiconductor structure according to claim 10 wherein said heterostructure comprises a gallium nitride layer on said substrate and an aluminum gallium nitride layer on said gallium nitride layer.

14. A semiconductor structure according to claim 13 further comprising a Group III nitride nucleation layer on said substrate wafer between said substrate wafer and said gallium nitride layer.

15. A semiconductor structure according to claim 13 wherein said aluminum gallium nitride layer is unintentionally doped.

16. A semiconductor structure according to claim 15 further comprising a doped aluminum gallium nitride layer on said unintentionally doped aluminum gallium nitride layer.

17. A semiconductor structure according to claim 16 further comprising a cap layer of unintentionally doped aluminum gallium nitride on said doped aluminum gallium nitride layer.

18. A semiconductor structure according to claim 17 wherein said cap layer and said doped layer have different atomic fractions of aluminum from one another.

19. A semiconductor structure according to claim 17 wherein said respective source, drain and gate contacts are made to said unintentionally doped layer.

20. A semiconductor precursor structure according to claim 1 comprising:
   a Group III nitride nucleation layer on said substrate wafer;
   a first Group III nitride epitaxial layer on said nucleation layer; and
   a second Group III nitride epitaxial layer on said first Group III nitride epitaxial layer and having a composition sufficiently different from the composition of said first layer to generate a two dimensional electron gas at the interface between said first and second layers;
   said precursor structure having a sheet resistivity standard deviation of no more than about one percent across the 100 millimeter structure.

21. A semiconductor precursor structure according to claim 20 wherein said silicon carbide substrate wafer is a single crystal.

22. A semiconductor precursor structure according to claim 20 comprising a third Group III nitride epitaxial layer on said second layer for increasing the electron mobility in the two dimensional electron gas.

23. A semiconductor precursor structure according to claim 20 wherein said precursor structure has a mobility standard deviation across the 100 millimeter structure of no more than about one percent.

24. A semiconductor precursor structure according to claim 20 having a sheet resistivity standard deviation of no more than about 0.75% across the 100 millimeter structure.

25. A semiconductor precursor structure according to claim 20 having a mobility standard deviation across the 100 millimeter structure of no more than about 0.43%.

26. A semiconductor precursor structure according to claim 21 wherein said silicon carbide single crystal substrate wafer has a polytype selected from the 3C, 4H, 6H, and 15R polytypes of silicon carbide.

27. A semiconductor structure according to claim 20 wherein said nucleation layer is selected from the group consisting of aluminum gallium nitride and aluminum nitride.

28. A semiconductor precursor structure according to claim 20 wherein said first Group III nitride epitaxial layer comprises gallium nitride.

29. A semiconductor precursor structure according to claim 28 wherein said second Group III nitride epitaxial layer comprises $Al_xGa_{1-x}N$ where $0<x\leq 1$.

30. A semiconductor precursor structure according to claim 29 wherein said third Group III nitride epitaxial layer comprises aluminum gallium nitride having different atomic fractions of aluminum and gallium from said second Group III nitride epitaxial layer.

31. A semiconductor structure comprising
a silicon carbide wafer having a diameter of at least 100 mm;
a Group III nitride heterostructure on said wafer; and
said wafer and heterostructure demonstrating a standard deviation in electron mobility across said wafer of less than 3 percent.

32. A semiconductor structure according to claim 31 demonstrating a standard deviation in electron mobility across said wafer of less than 1 percent.

33. A semiconductor structure according to claim 31 wherein said silicon carbide is semi-insulating.

34. A semiconductor structure according to claim 31 with an electron mobility at room temperature of at least 2000 $cm^2$/V-s.

35. A semiconductor structure comprising
a silicon carbide wafer having a diameter of at least 100 mm;
a Group III nitride heterostructure on said wafer; and
said wafer and heterostructure demonstrating a standard deviation in carrier density across said wafer of less than 3.3%.

36. A semiconductor structure according to claim 35 wherein said silicon carbide is semi-insulating.

37. A semiconductor structure according to claim 35 with a carrier density of about 9E12 $cm^{-2}$.

38. A semiconductor precursor structure according to claim 35 wherein said heterostructure includes an aluminum gallium nitride epitaxial layer above said substrate.

39. A semiconductor structure comprising:
an epitaxial layer of Group III nitride containing aluminum on a compatible substrate;
said Group III nitride layer having a diameter of at least 100 millimeters; and
said Group III nitride layer having a ratio of minimum to maximum aluminum content of at least 0.9.

40. A semiconductor structure according to claim 39 wherein said Group III nitride layer has a ratio of minimum to maximum aluminum content of at least 0.99.

41. A plurality of silicon carbide wafers that incorporate the structure of claim 39;
an AlGaN barrier layer as the top surface of each said wafer; and
said wafers having a ratio of edge to center percentage of aluminum in said AlGaN barrier layer of between about 0.98 and 1.02.

42. A plurality of semi-insulating silicon carbide wafers according to claim 41.

43. A plurality according to claim 41 of at least 10 wafers.

44. A plurality according to claim 41 of at least 15 wafers.

45. A semiconductor structure comprising:
a Group III nitride epitaxial layer selected from the group consisting of gallium nitride and aluminum gallium nitride on a compatible substrate;
said Group III nitride layer having a diameter of at least 100 millimeters; and
said Group III nitride layer having a ratio of minimum to maximum thickness of at least 0.8.

46. A semiconductor structure according to claim 45 wherein said epitaxial layer is aluminum gallium nitride and has a ratio of minimum to maximum thickness of at least 0.92.

47. A semiconductor structure according to claim 45 wherein said epitaxial layer is gallium nitride and has a ratio of minimum to maximum thickness of at least 0.92.

48. A plurality of silicon carbide wafers that incorporate the structure of claim 45;
a Group III nitride heterostructure on each said wafer;
an AlGaN barrier layer as the top surface of each said wafer; and
75% of said wafers having a ratio of minimum to maximum thickness of said AlGaN barrier layer of at least 0.8.

49. A plurality of silicon carbide wafers according to claim 48 having a ratio of minimum to maximum thickness of said AlGaN barrier layer of at least 0.92.

50. A plurality of semi-insulating silicon carbide wafers according to claim 48.

51. A plurality according to claim 48 of at least 10 wafers.

52. A plurality according to claim 48 of at least 15 wafers.

53. A plurality of silicon carbide wafers according to claim 48 wherein 50% of said wafers having a ratio of edge to center thickness of said AlGaN barrier layer of at least 0.94.

54. A plurality of silicon carbide wafers according to claim 48 wherein 25% of said wafers having a ratio of edge to center thickness of said AlGaN barrier layer of at least 0.95.

55. A semiconductor structure comprising:
a silicon carbide wafer having a diameter of at least about 100 millimeters;
a Group III nitride layer on said silicon carbide wafer and having a diameter substantially the same as said silicon carbide wafer; and
said wafer and epitaxial layer having a warp less than 100 microns.

56. A semiconductor structure according to claim 55 wherein said silicon carbide wafer has a thickness less than one millimeter and said Group III nitride layer has a thickness greater than one micron.

57. A semiconductor structure according to claim 55 with a warp of less than 50 microns.

58. A semiconductor structure according to claim 55 with a warp of less than 25 microns.

59. A semiconductor structure according to claim 55 with a warp of less than 10 microns.

60. A semiconductor structure according to claim 55 with a warp of less than 5 microns.

61. A semiconductor structure comprising:
a silicon carbide wafer having a diameter of at least 100 millimeters;
a Group III nitride epitaxial layer on said silicon carbide wafer and having substantially the same size as said wafer; and said wafer and epitaxial layer having a bow of less than 100 microns.

62. A semiconductor structure according to claim 61 wherein said epitaxial layer has a thickness greater than 1 micron and said silicon carbide wafer has a thickness less than 1 millimeter.

63. A semiconductor structure according to claim 61 having a bow of less than 50 microns.

64. A semiconductor structure according to claim 61 having a bow of less than 25 microns.

65. A semiconductor structure according to claim 64 having a total Group III nitride thickness greater than 5 microns and a silicon carbide thickness less than 1 millimeter.

66. A semiconductor structure according to claim 61 having a bow of less than 10 microns.

67. A semiconductor structure according to claim 61 having a bow of less than 5 microns.

68. A semiconductor structure according to claim 67 with a total Group III nitride thickness greater than 1 micron and a silicon carbide thickness less than 1 millimeter.

69. A semiconductor structure comprising:
   an epitaxial layer of Group III nitride containing aluminum on a compatible substrate;
   said Group III nitride layer having a diameter of at least 100 millimeters; and
   said Group III nitride layer demonstrating a standard deviation in aluminum content of less than 5 percent.

70. A semiconductor structure according to claim 69 wherein said Group III nitride layer demonstrates a standard deviation in aluminum content of less than 1.36 percent.

71. A plurality of 100 mm wafers that incorporate the structure of claim 69 wherein 75% of said wafers have a deviation in aluminum content of their respective Group III nitride layer of 1.95 percent or less.

72. A plurality of at least 15 wafers according to claim 71.

73. A semiconductor structure according to claim 69 wherein said substrate comprises silicon carbide.

74. A plurality of 100 millimeter wafers, each said wafer comprising:
   an epitaxial layer of Group III nitride containing aluminum on a compatible substrate;
   said Group III nitride layer having a diameter of at least 100 millimeters; and
   at least 75 percent of said wafers demonstrating a standard deviation in thickness of said Group III nitride layer of less than 7.2 percent.

75. A plurality of wafers according to claim 74 wherein 75 percent of said Group III nitride layers demonstrate a standard deviation in thickness of less than 2.1 percent.

76. A plurality of at least 15 wafers according to claim 74.

77. A plurality of wafers according to claim 74 wherein said compatible substrates comprise silicon carbide.

* * * * *